(12) United States Patent
Kotsubo

(10) Patent No.: US 7,244,159 B2
(45) Date of Patent: Jul. 17, 2007

(54) ELECTROMAGNETIC-SHIELDING TRANSPARENT WINDOW MEMBER AND METHOD FOR PRODUCING THE SAME

(75) Inventor: Hidefumi Kotsubo, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 11/103,478

(22) Filed: Apr. 12, 2005

(65) Prior Publication Data

US 2005/0178569 A1 Aug. 18, 2005

Related U.S. Application Data

(63) Continuation of application No. PCT/JP03/13156, filed on Oct. 15, 2003.

(30) Foreign Application Priority Data

Oct. 28, 2002 (JP) ............................. 2002-312976

(51) Int. Cl.
*H01J 9/12* (2006.01)
(52) U.S. Cl. ........................... 445/49; 445/52; 427/531
(58) Field of Classification Search ................ 313/112, 313/479, 492, 313, 326, 348; 445/49, 52; 427/523, 531
See application file for complete search history.

(56) References Cited

U.S. PATENT DOCUMENTS

| | | | | | |
|---|---|---|---|---|---|
| 4,631,214 | A | * | 12/1986 | Hasegawa | ................... 428/68 |
| 4,978,812 | A | * | 12/1990 | Akeyoshi et al. | ...... 174/35 MS |
| 6,034,474 | A | * | 3/2000 | Ueoka et al. | ................ 313/584 |
| 6,086,979 | A | * | 7/2000 | Kanbara et al. | ............ 428/209 |
| 6,090,473 | A | * | 7/2000 | Yoshikawa et al. | ......... 428/209 |
| 6,469,440 | B1 | * | 10/2002 | Saito et al. | .................. 313/582 |
| 6,506,090 | B2 | * | 1/2003 | Kotsubo et al. | .............. 445/49 |
| 6,686,536 | B2 | * | 2/2004 | Tone et al. | ............ 174/35 MS |
| 6,882,091 | B2 | * | 4/2005 | Kotsubo et al. | ............ 313/112 |

FOREIGN PATENT DOCUMENTS

| | | |
|---|---|---|
| JP | 10-163673 A | 6/1998 |
| JP | 2002-185184 A | 6/2002 |
| JP | 2002-196685 A | 7/2002 |
| JP | 2002-223095 A | 8/2002 |
| JP | 2002223095 A * | 8/2002 |

OTHER PUBLICATIONS

International Search Report.

* cited by examiner

*Primary Examiner*—Mariceli Santiago
*Assistant Examiner*—Kevin Quarterman
(74) *Attorney, Agent, or Firm*—Sughrue Mion, PLLC

(57) ABSTRACT

A method for producing an electromagnetic-shielding transparent window member including a transparent film and a patterned conductor disposed thereon includes the steps of applying a resin coating material containing a catalyst for electroless plating to the transparent film to form a patterned resin having the same pattern as the patterned conductor to be formed; and depositing a conductive material only on the patterned resin by electroless plating to form the patterned conductor.

6 Claims, 1 Drawing Sheet

ELECTROMAGNETIC-SHIELDING TRANSPARENT WINDOW MEMBER AND METHOD FOR PRODUCING THE SAME

CROSS REFERENCE TO RELATED APPLICATION

This is a continuation application of PCT/JP03/13156 filed on Oct. 15, 2003.

BACKGROUND OF THE INVENTION

1. Field of the Invention

The present invention relates to electromagnetic-shielding transparent window members useful as, for example, front filters for plasma display panels (PDPs) or window materials (for example, patch films) used in buildings requiring electromagnetic shielding, such as hospitals, and also relates to methods for producing the window members. In particular, the present invention relates to an electromagnetic-shielding transparent window member including a film and a patterned conductor formed thereon, and a method for producing the window member.

2. Description of the Related Art

In recent years, the widespread use of office automation (OA) equipment and communications equipment has developed the problem of electromagnetic waves generated from such equipment. For example, the electromagnetic waves may affect the human body and cause precision equipment to malfunction.

To cope with the problem, electromagnetic-shielding transparent window members have been developed as front filters for PDPs in OA equipment and have been put into practical use. Such window members are also used in sites with installed precision equipment, such as hospitals and laboratories, to protect the equipment from electromagnetic waves generated from, for example, cellular phones.

A conventional electromagnetic-shielding transparent window member mainly includes a conductive mesh, like a wire mesh, or transparent conductive film disposed between and integrated with transparent substrates, such as acrylic boards.

General conductive meshes for use in conventional electromagnetic-shielding transparent window members have a wire diameter of 10 to 500 µm, range from about 5 to 500 mesh, and have an aperture ratio below 75%.

In general, conductive meshes composed of thicker conductive fibers are coarser while conductive meshes composed of thinner conductive fibers are finer. A coarse mesh can be produced with thick fibers, but is extremely difficult to produce with thin fibers.

Accordingly, conventional electromagnetic-shielding transparent window members including such conductive meshes have a light transmittance of, at most, about 70%. The window members therefore cannot provide high light transmittance.

In addition, conventional conductive meshes readily cause a moiré pattern (interference fringes) in connection with pixel pitches of light-emitting panels equipped with the electromagnetic-shielding transparent window members.

The use of a transparent conductive film requires design changes such as the formation of through holes in a transparent substrate to bring the film into conduction. Such design changes complicate the assembly and incorporation of electromagnetic-shielding transparent window members into casings.

SUMMARY OF THE INVENTION

An object of the present invention is to provide an electromagnetic-shielding transparent window member including a patterned conductor formed by electroless plating and a production method requiring fewer steps for forming the patterned conductor to produce the electromagnetic-shielding transparent window member readily and efficiently at low cost.

The present invention provides a method for producing an electromagnetic-shielding transparent window member including a transparent film and a patterned conductor formed thereon by electroless plating. This method includes the steps of applying a resin coating material containing a catalyst for electroless plating to the transparent film to form a patterned resin having the same pattern as the patterned conductor to be formed; and depositing a conductive material only on the patterned resin by electroless plating to form the patterned conductor.

The present invention further provides an electromagnetic-shielding transparent window member including a transparent film; a patterned resin disposed on the transparent film and containing a catalyst for electroless plating; and a patterned conductor made of a layer of conductive material formed on the patterned resin by electroless plating.

According to the electromagnetic-shielding transparent window member and the method for producing the window member, a fine, precise pattern can be formed with the resin coating material, and a patterned conductor having a significantly small line width and high aperture ratio can be formed on the patterned resin by electroless plating.

The aperture ratio is calculated from the line width of a mesh and the number of lines per inch of width.

In the present invention, the patterned resin is formed with the catalyst-containing resin coating material, and a conductive material is deposited only on the patterned resin by electroless plating. This method therefore does not involve, for example, etching with an environmentally unfriendly etchant, such as chromium trioxide, and neutralization with a neutralizing liquid such as hydrochloric acid. Thus the patterned conductor can easily be formed at low cost. In addition, the patterned resin does not peel off the transparent film with acid, alkali, or heat.

A patterned resin tends to peel off a transparent film by the steps of acid etching, adding a catalyst, and activation for depositing a conductive material on the patterned resin by electroless plating. According to the present invention, such steps may be eliminated by the use of a patterned resin containing a catalyst, and thus the patterned resin does not peel off the transparent film.

The method according to the present invention can therefore readily produce an electromagnetic-shielding transparent window member including a patterned conductor having, for example, a line width of 200 µm or less and an aperture ratio of 75% or more with fewer steps at low cost.

DESCRIPTION OF THE PREFERRED EMBODIMENTS

An embodiment of the present invention will now be described with reference to the drawings.

Figure 1A:
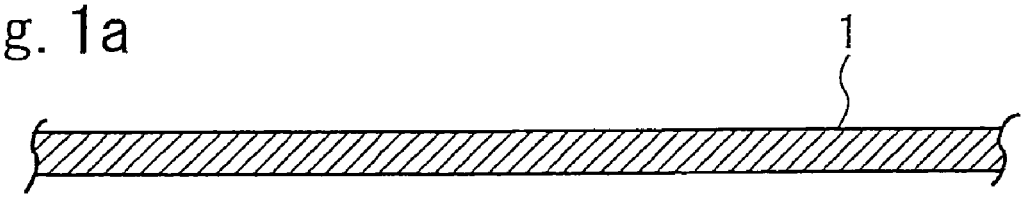
FIGS. 1A, 1B, and 1C are schematic sectional views for illustrating a method for producing an electromagnetic-shielding transparent window member according to an embodiment of the present invention.
Figure 1B:
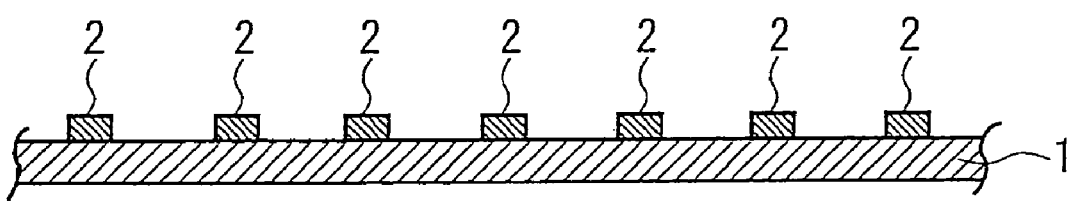
Figure 1C:
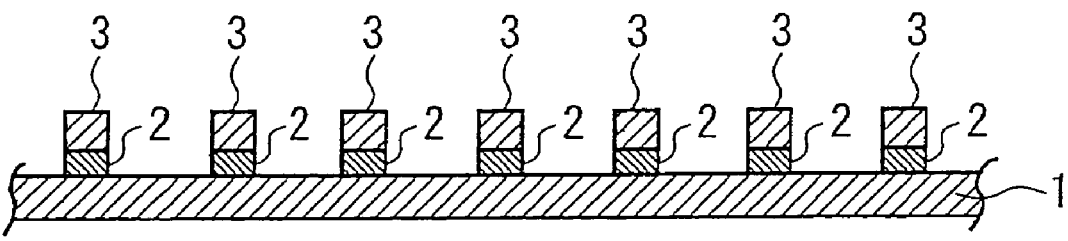

Referring to FIGS. 1A and 1B, in this embodiment, a resin coating material containing a catalyst for electroless plating is applied to a transparent film 1 by printing to form a grid-patterned resin 2. Referring to FIG. 1C, the transparent film 1 is treated by electroless plating to form a patterned conductor 3 made of a conductive plating layer only on the patterned resin 2.

The patterned conductor 3, which is formed on the grid-patterned resin 2, has the same grid pattern as the patterned resin 2. The line width of the grid-patterned conductor 3 can therefore be reduced by reducing the line width of the patterned resin 2. If the line width of the grid-patterned resin 2 is reduced to increase its aperture area, the grid-patterned conductor 3 can attain a higher aperture ratio.

Preferred examples of the materials for the above components are described below.

The transparent film 1 used may be any transparent film having high resistance to, for example, heat and chemicals, typically a general-purpose engineering plastic film. The transparent film 1 preferably has a low affinity for plating as its own chemical characteristic. In addition, the transparent film 1 is preferably not etched or does not have a high affinity for plating when brought into contact with a plating solution. Examples of the transparent film 1 include polyester films, polyarylate films, and cycloolefin films.

The transparent film 1 generally has a thickness of about 1 μm to 5 mm, depending on, for example, the uses of the electromagnetic-shielding transparent window member.

The patterned resin 2 is preferably formed on the transparent film 1 by printing. The resin contained in the resin coating material for forming the patterned resin 2 is a resin that can readily be processed into a coating material and has high adhesiveness to the above transparent film 1. Examples of the resin used include urethane resin, acrylic resin, vinyl chloride resin, polyester resin, epoxy resin, polyolefin resin, and photo-curable resins.

The catalyst for electroless plating contained in the resin coating material may be one or more materials selected from the group consisting of reducing metals, such as palladium, silver, tin, copper, and nickel, and salts and complexes thereof. Among them, palladium is preferred, which has a large catalytic effect. Silver is suitable for being processed into a coating material since silver is relatively resistant to oxidation and can readily be processed into fine particles.

The content of the catalyst for electroless plating in the resin coating material preferably ranges from 1% to 50% by weight of the resin content in the resin coating material. An excessively low content of the catalyst cannot efficiently deposit the conductive material by electroless plating, thus failing to form a precisely patterned conductor. On the other hand, an excessively high content of the catalyst deteriorates the coating properties of the patterned resin 2, and makes it difficult to form the patterned resin 2.

In the preparation of the resin coating material, the viscosity thereof may be suitably adjusted by adding a solvent such as toluene, ethyl acetate, and methyl ethyl ketone (MEK) to the major component, namely the resin, and the catalyst. The resin coating material may also contain other additives such as a stabilizer and a colorant.

The patterned resin 2 is preferably formed in a grid pattern by printing. In addition, the patterned resin 2 preferably has a line width of 200 μm or less, more preferably 100 μm or less, still more preferably 30 μm or less. Preferred examples of the printing method used include gravure printing, screen printing, inkjet printing, and electrostatic printing. Among them, gravure printing is particularly preferred for achieving thinner lines.

The print thickness of the patterned resin 2 is generally about 0.1 to 10 μm, though it is not particularly limited.

Preferred examples of the conductive material for the patterned conductor 3 include metals such as aluminum, nickel, indium, chromium, gold, vanadium, tin, cadmium, silver, platinum, copper, titanium, cobalt, and zinc, and alloys thereof. Among them, pure copper, nickel, chromium, zinc, tin, silver, and gold, and alloys thereof are particularly preferred.

If the patterned conductor 3 has an excessively small thickness, it undesirably lacks electromagnetic shielding performance. If, on the other hand, the patterned conductor 3 has an excessively large thickness, it affects the thickness of the resultant electromagnetic-shielding transparent window member, and narrows the viewing angle. In addition, the patterned conductor 3 having an excessively large thickness spreads in the width direction in plating to have a larger line width and a lower aperture ratio. Accordingly, the patterned conductor 3 preferably has a thickness of about 0.1 to 10 μm.

The patterned resin 2 may be degreased with, for example, sulfuric acid or hydrochloric acid before electroless plating to increase the affinity of the patterned resin 2 for plating.

The patterned conductor 3 may be blackened to attain antiglare properties by, for example, oxidation or sulfidation of the metal film, black plating with a chromium alloy or a Sn—Ni alloy, or the application of a black ink or coating material to the patterned conductor 3.

The electromagnetic-shielding transparent window member thus produced may be a one-piece film or a continuous web film unwound from a roll.

EXAMPLES

The present invention will be more specifically described with the example below, though the invention is not limited to the example.

Example 1

A catalyst-containing resin coating material ("Melcoat NMY Type III," manufactured by Meltex Inc.) was applied to a polyester film having a thickness of 100 μm in a grid pattern by printing. This coating material is prepared by adding 10% by weight of a catalyst for electroless plating, namely palladium chloride, to urethane resin. The resultant patterned resin had a regular square grid pattern including lines 20 μm wide and squares with sides 250 μm long. This patterned resin had an aperture ratio of 80% and a print thickness of about 2 μm after drying.

After the grid-patterned resin was degreased with 5% sulfuric acid, a copper film having an average thickness of 2 μm was deposited on the resin by electroless plating with a copper electroless plating solution (60° C.) having the following composition:

[Composition of Copper Electroless Plating Solution (Alkaline)]
Copper sulfate: pentahydrate: 13 g/l
NaOH: 7.5 g/l
HCOH: 13 ml/l Finally, the patterned conductor was blackened by oxidation to produce an electromagnetic-shielding transparent window member. No copper was deposited on the polyester film.

The above blackening treatment was performed by oxidizing the copper plating with a sodium chlorite ($NaClO_2$) aqueous solution (5% to 30%) at 50° C. for three to ten minutes (or with a sodium hypochlorite (NaOCl) aqueous solution (5% to 30%) at 80° C. for one to five minutes)).

The blackening treatment may also be performed by sulfidation, for example by sulfurizing the copper plating with a hydrogen sulfide aqueous solution (5% to 30%) at 25° C. for 5 to 60 seconds.

As in the case of the patterned resin, the patterned conductor formed on the film had a regular square grid pattern including lines 20 μm wide and squares with sides 250 μm long, and had an aperture ratio of 80%.

As described above, the present invention allows easy, low-cost production of an electromagnetic-shielding transparent window member that includes a patterned conductor having a small line width and a high aperture ratio, has excellent electromagnetic-shielding properties and high light transmittance, and causes no moiré fringes.

What is claimed is:

1. A method for producing an electromagnetic-shielding transparent window member including a transparent film and a patterned conductor disposed thereon, the method comprising the steps of:

applying a resin coating material containing a catalyst for electroless plating to the transparent film to form a patterned resin having the same pattern as the patterned conductor to be formed;

depositing a conductive material only on the patterned resin by electroless plating to form the patterned conductor, the conductive material comprising copper; and blackening the patterned conductor to attain antiglare properties after the step of forming the patterned conductor, wherein the antiglare properties are attained by performing at least one of oxidation of the patterned conductor, sulfidation of the patterned conductor, black plating with a chromium alloy and black plating with a Sn—Ni alloy.

2. The method for producing an electromagnetic-shielding transparent window member according to claim 1, wherein the content of the catalyst in the resin coating material ranges from 1% to 50% by weight of the resin content.

3. The method for producing an electromagnetic-shielding transparent window member according to claim 1, wherein the patterned resin is formed in a grid pattern.

4. The method for producing an electromagnetic-shielding transparent window member according to claim 1, wherein the patterned resin is formed by printing.

5. The method for producing an electromagnetic-shielding transparent window member according to claim 4, wherein the printing is gravure printing.

6. The method for producing an electromagnetic-shielding transparent window member according to claim 1, wherein the patterned conductor has a thickness of 0.1 to 10 μm.

* * * * *